United States Patent
Ku et al.

(10) Patent No.: US 9,066,434 B2
(45) Date of Patent: Jun. 23, 2015

(54) CIRCUIT BOARD CAPABLE OF PREVENTING CONTACT OF A GOLD FINGER AND SOLDER

(71) Applicant: Wistron Corporation, New Taipei (TW)

(72) Inventors: Chen-Liang Ku, New Taipei (TW); Ko-Chin Lee, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 303 days.

(21) Appl. No.: 13/664,434

(22) Filed: Oct. 31, 2012

(65) Prior Publication Data
US 2013/0153274 A1    Jun. 20, 2013

(30) Foreign Application Priority Data
Dec. 14, 2011    (TW) .............................. 100146152 A

(51) Int. Cl.
*H05K 1/09*    (2006.01)
*H05K 1/11*    (2006.01)
*H05K 3/34*    (2006.01)

(52) U.S. Cl.
CPC ................ *H05K 1/11* (2013.01); *H05K 3/3484* (2013.01); *H05K 2201/09036* (2013.01); *H05K 2201/09472* (2013.01)

(58) Field of Classification Search
CPC ........... H05K 3/00; H05K 3/10; H05K 3/242; H05K 3/36; H05K 1/117; H05K 5/025; H05K 7/20; H01L 23/48
USPC ........... 174/257, 254, 261; 361/715; 257/692; 29/846, 852
See application file for complete search history.

(56) References Cited

U.S. PATENT DOCUMENTS

| | | | | |
|---|---|---|---|---|
| 4,687,267 | A * | 8/1987 | Header et al. | 439/62 |
| 6,291,778 | B1 * | 9/2001 | Asai et al. | 174/263 |
| 7,359,204 | B1 * | 4/2008 | Jang et al. | 361/715 |
| 7,596,863 | B2 * | 10/2009 | Bhatt et al. | 29/852 |
| 2003/0177865 | A1 * | 9/2003 | Ono et al. | 75/331 |
| 2008/0160331 | A1 * | 7/2008 | Kukimoto et al. | 428/549 |
| 2008/0217758 | A1 * | 9/2008 | Liao | 257/692 |
| 2011/0266042 | A1 * | 11/2011 | Beaman | 174/261 |
| 2012/0030943 | A1 * | 2/2012 | Hiew et al. | 29/846 |

FOREIGN PATENT DOCUMENTS

| | | |
|---|---|---|
| CN | 201278064 Y | 7/2009 |
| TW | 200730065 | 8/2007 |
| TW | 201012325 | 3/2010 |

OTHER PUBLICATIONS

Office action mailed on Jul. 31, 2013 for the Taiwan application No. 100146152, filing date: Dec. 14, 2011, p. 2 line 2~13, line 17~21, p. 3 line 6~9 and line 25~26 and p. 4 line 1.
Office action mailed on Jan. 21, 2015 for the China application No. 201110455279.9, p. 3 line 4~25, line 29~32 and line 35~40, p. 4 line 1~13, line 6~8, line 12~15, line 21~25 and line 33~39 and p. 5 line 1~18.

* cited by examiner

*Primary Examiner* — Xiaoliang Chen
(74) *Attorney, Agent, or Firm* — Winston Hsu; Scott Margo

(57) ABSTRACT

A circuit board includes a substrate whereon a sunken portion is formed. The circuit board further includes a gold finger structure disposed inside the sunken portion. A height difference is formed between a top surface of the gold finger structure and a surface of the substrate substantially.

6 Claims, 6 Drawing Sheets

CIRCUIT BOARD CAPABLE OF PREVENTING CONTACT OF A GOLD FINGER AND SOLDER

BACKGROUND OF THE INVENTION

1. Field of the Invention

The disclosure relates to a circuit board capable of preventing contact of a gold finger and solder, and more specifically, to a circuit board having a substrate whereon a sunken portion is formed for accommodating a gold finger structure, so as to prevent contact of the gold finger and solder.

2. Description of the Prior Art

A circuit board with a gold finger structure is widely utilized in electronic products, such as a mobile phone, a PDA, a computer, and so on. However, the electrical function will be affected as the gold finger structure is stained with solder, due to insulating oxidation generated by electrochemistry reaction of stannum with higher activity, resulting in affecting signal transmission. Hence, the gold finger structure is prevented from contacting with the solder. In general, a pad and the gold finger structure of the conventional circuit board are on the same horizontal level. After stencil printing or wiping the stencil, the solder is often left beside a hole or on a bottom of the stencil, so that the solder will be stained on the gold finger structure of the next circuit board after the next circuit board contacts with the stencil. Then the solder stained on the gold finger structure is heated and hardened, leading to affection of the electrical function.

There are several ways for solving the above-mentioned problem. The stencil can be wiped more frequently or by other wiping operation, such as wet wipe, dry wipe or vacuum wipe, but it increases cycle time of production and manufacture cost. Besides, a size of the hole on the stencil can be reduced for preventing the solder powder from bouncing outwardly, but it reduces the soldering efficiency. In addition, a solder mask type can be adhered to the gold finger structure during the stencil printing, but it not only increases labor hours and cost of the solder mask type but also remains adhesive on the gold finger structure. Therefore, there is a need to find a solution to prevent the solder from staining on the gold finger structure with low manufacture cost and high production yield.

SUMMARY OF THE INVENTION

The disclosure provides a circuit board having a substrate whereon a sunken portion is formed for accommodating a gold finger structure, so as to prevent contact of the gold finger and solder, to solve the problems mentioned above.

According to the claimed invention, a circuit board includes a substrate whereon a sunken portion is formed. The circuit board further includes a gold finger structure disposed inside the sunken portion. A height difference is formed between a top surface of the gold finger structure and a surface of the substrate substantially.

According to the claimed invention, the height difference between the top surface of the gold finger structure and the surface of the substrate is substantially greater than a particle size of solder paste.

According to the claimed invention, the height difference between the top surface of the gold finger structure and the surface of the substrate is substantially greater than 50 μm.

According to the claimed invention, the circuit board further includes a pad disposed on the substrate, and the height difference being formed between a surface of the pad and the top surface of the gold finger structure substantially.

According to the claimed invention, the circuit board further includes a solder mask layer disposed on the substrate where the sunken portion and the pad are not disposed.

According to the claimed invention, the circuit board further includes a peelable mask film peelably adhered to the top surface of the gold finger structure.

According to the claimed invention, a thickness of the peelable mask film is substantially less than or equal to the height difference between the top surface of the gold finger structure and the surface of the substrate.

According to the claimed invention, the peelable mask film is made of high temperature endurable material.

The circuit board of the disclosure has the substrate whereon the sunken portion is formed for accommodating the gold finger structure. It can prevent the gold finger structure from being stained with the solder and has low manufacture cost and high production yield. In addition, there is no need to utilize a solder mask type adhered to the gold finger structure so as to reduce labor hours, and it also can reduce cycle time of production by reducing wiping frequency so as to increase production efficiency.

These and other objectives of the present invention will no doubt become obvious to those of ordinary skill in the art after reading the following detailed description of the embodiment that is illustrated in the various figures and drawings.

DETAILED DESCRIPTION

Figure 1:
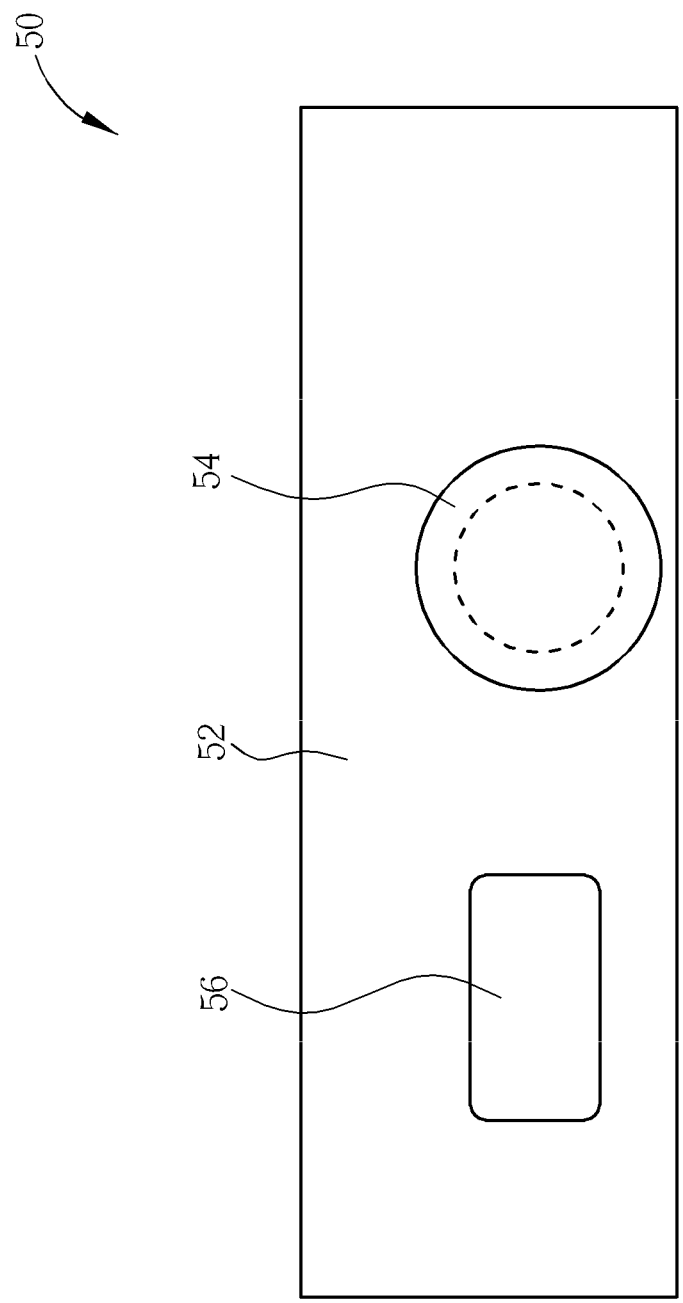
FIG. 1 and FIG. 2 are respectively a top view and a sectional view of a circuit board according to an embodiment of the disclosure.
Figure 2:
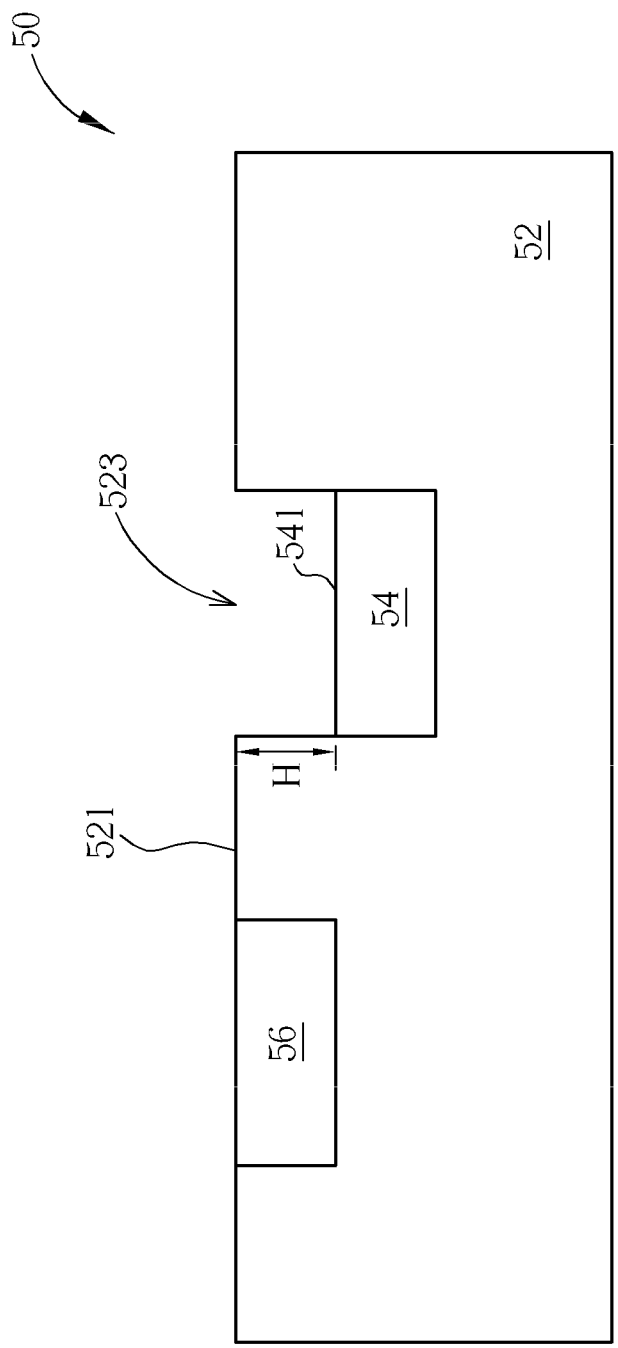

Please refer to FIG. 1 and FIG. 2. FIG. 1 and FIG. 2 are respectively a top view and a sectional view of a circuit board 50 according to an embodiment of the disclosure. The circuit board 50 includes a substrate 52 having a surface 521 whereon a sunken portion 523 is formed. The circuit board 50 further includes a gold finger structure 54 disposed inside the sunken portion 523 on the substrate 52. A height difference H is formed between a top surface 541 of the gold finger structure 54 and the surface 521 of the substrate 52 substantially. The height difference H between the top surface 541 of the gold finger structure 54 and the surface 521 of the substrate 52 can be substantially greater than a particle size of solder paste. For example, a diameter of a solder particle is about 28 μm to 38 μm generally. Accordingly, the height difference H between the top surface 541 of the gold finger structure 54 and the surface 521 of the substrate 52 can be substantially greater than 50 μm. Furthermore, the circuit board 50 can be a multilayer circuit board, and the sunken portion 523 can be formed on an outer layer and the gold finger structure 54 is disposed on an inner layer. It differs from the conventional gold finger structure disposed on the outer layer of the circuit board.

Figure 3:
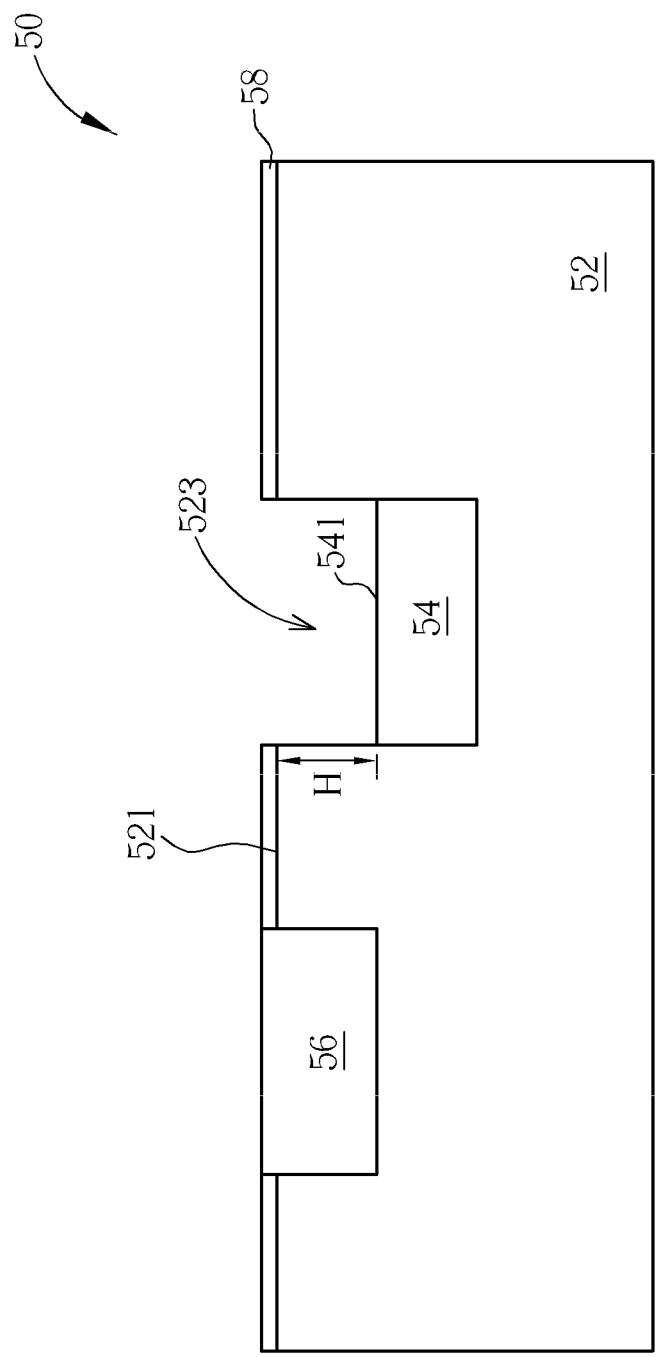
FIG. 3 is a sectional view of the circuit board according to another embodiment of the disclosure.

The circuit board 50 further includes a pad 56 disposed on the substrate 52. Solder paste can be disposed on the pad 56 for soldering electronic components, such as LED components. The height difference H also can be formed between a surface of the pad 56 and the top surface 541 of the gold finger structure 54 substantially. Please refer to FIG. 3. FIG. 3 is a sectional view of the circuit board 50 according to another embodiment of the disclosure. In this embodiment, a solder mask layer 58 can be disposed on the substrate 52 where the sunken portion 523 and the pad 56 are not disposed. The solder mask layer 58 can insulate inner copper wires of the circuit board 50 from the solder. The height difference H also can be formed between a surface of the solder mask layer 58 and the top surface 541 of the gold finger structure 54 substantially.

Figure 4:
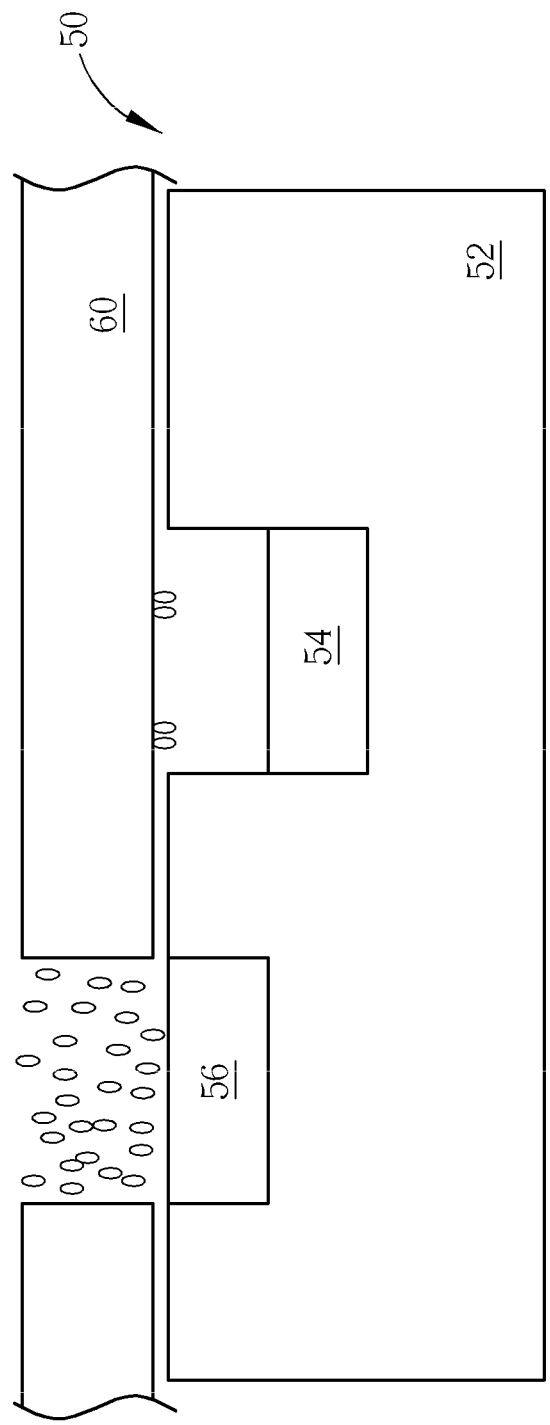
FIG. 4 is a diagram of the circuit board when soldering according to the embodiment of the disclosure.

Please refer to FIG. 2 and FIG. 4. FIG. 4 is a diagram of the circuit board 50 when soldering according to the embodiment of the disclosure. The solder paste can be disposed on the pad 56 of the circuit board 50 through holes on a stencil 60. After stencil printing or wiping the stencil 60, the solder might be left beside the hole or on a bottom of the stencil 60. Because there is the height difference H between the pad 56 of the circuit board 50 and the gold finger structure 54, that is, the gold finger structure 54 is sunken relative to the pad 56 of the circuit board 50, the solder can not contact and stain on the gold finger structure 54 of the circuit board 50, for preventing affection of the electrical function. To ensure the gold finger structure 54 from contacting the solder, the height difference H between the top surface 541 of the gold finger structure 54 and the surface 521 of the substrate 52 can be substantially greater than 50 μm, that is, can be substantially greater than a particle size of solder paste, wherein a diameter of a solder particle is about 28 μm to 38 μm generally, for achieving high production yield.

Figure 5:
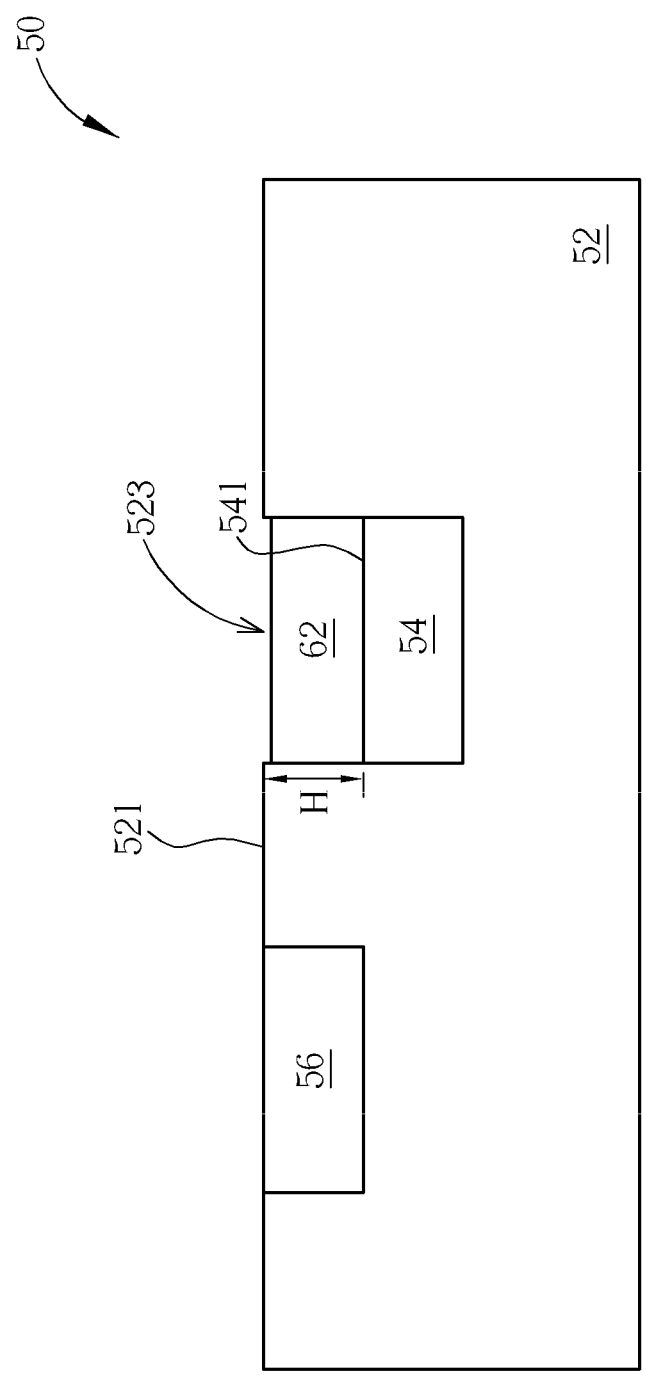
FIG. 5 is a sectional view of the circuit board according to the other embodiment of the disclosure.
Figure 6:
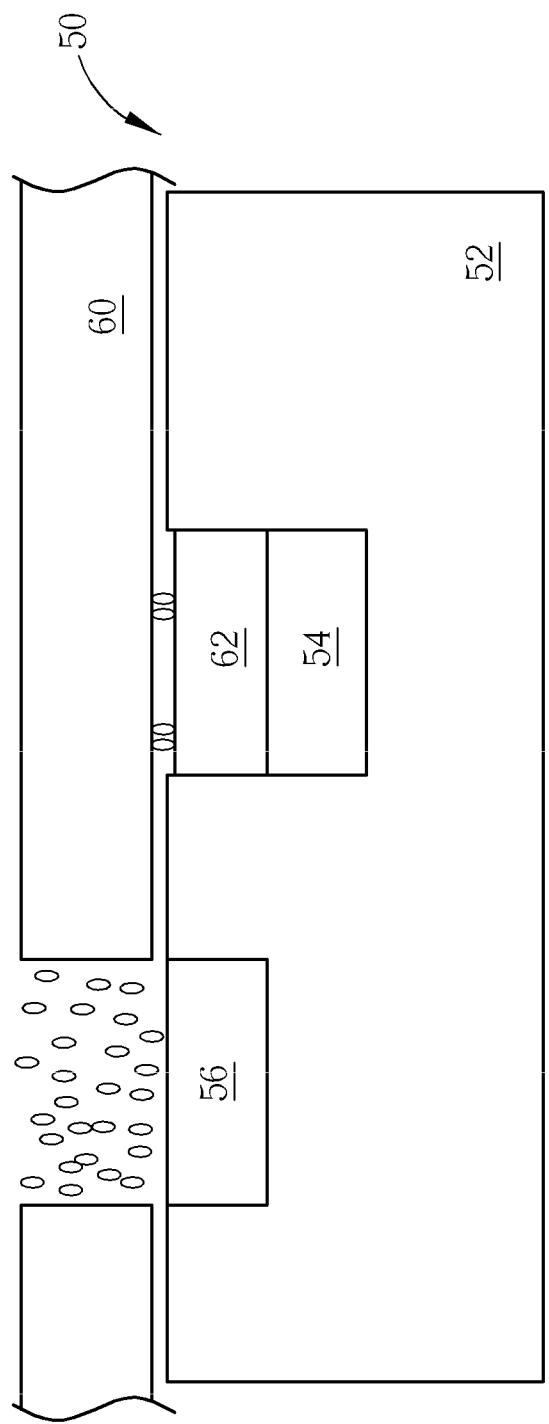
FIG. 6 is a diagram of the circuit board when soldering according to the other embodiment of the disclosure.

Please refer to FIG. 5 and FIG. 6. FIG. 5 is a sectional view of the circuit board 50 according to the other embodiment of the disclosure. FIG. 6 is a diagram of the circuit board 50 when soldering according to the other embodiment of the disclosure. In this embodiment, the circuit board 50 can selectively include a peelable mask film 62 peelably adhered to the top surface 541 of the gold finger structure 54. A thickness of the peelable mask film 62 can be substantially less than or equal to the height difference H between the top surface 541 of the gold finger structure 54 and the surface 521 of the substrate 52. It means the peelable mask film 62 is sunken inside the sunken portion 523 or aligns with the surface 521 of the substrate 52. The peelable mask film 62 can be made of high temperature endurable material, which can be endure 250° C., for preventing melt as being heated over hardening temperature of the solder paste. As shown in FIG. 6, although the solder remaining on the stencil 60 might contact with the peelable mask film 62, the solder still can not contact with the gold finger structure 54 by isolation of the peelable mask film 62. Then the peelable mask film 62 can be removed from the gold finger structure 54 after the soldering procedure and before a function test, for preventing the gold finger structure 54 from contacting with the solder.

In contrast to the prior art, the disclosure discloses the circuit board having the substrate whereon the sunken portion is formed for accommodating the gold finger structure. It can prevent the gold finger structure from being stained with the solder and has low manufacture cost and high production yield. In addition, there is no need to utilize a solder mask type adhered to the gold finger structure so as to reduce labor hours, and it also can reduce cycle time of production by reducing wiping frequency so as to increase production efficiency.

Those skilled in the art will readily observe that numerous modifications and alterations of the device and method may be made while retaining the teachings of the invention.

What is claimed is:

1. A circuit board, comprising:
   a substrate whereon a sunken portion is formed;
   a gold finger structure disposed inside the sunken portion on the substrate, and a height difference being formed between a top surface of the gold finger structure and a surface of the substrate substantially, wherein the height difference between the top surface of the gold finger structure and the surface of the substrate is substantially greater than a particle size of solder paste; and
   a peelable mask film peelably adhered to the top surface of the gold finger structure.

2. The circuit board of claim 1, wherein the height difference between the top surface of the gold finger structure and the surface of the substrate is substantially greater than 50 μm.

3. The circuit board of claim 1, further comprising a pad disposed on the substrate, and the height difference being formed between a surface of the pad and the top surface of the gold finger structure substantially.

4. The circuit board of claim 3, further comprising a solder mask layer disposed on the substrate where the sunken portion and the pad are not disposed.

5. The circuit board of claim 1, wherein a thickness of the peelable mask film is substantially less than or equal to the height difference between the top surface of the gold finger structure and the surface of the substrate.

6. The circuit board of claim 1, wherein the peelable mask film is made of high temperature endurable material.

\* \* \* \* \*